(12) United States Patent
Horng et al.

(10) Patent No.: US 9,529,027 B2
(45) Date of Patent: Dec. 27, 2016

(54) METHOD FOR ESTIMATING PCB RADIATED EMISSIONS

(71) Applicant: NATIONAL SUN YAT-SEN UNIVERSITY, Kaohsiung (TW)

(72) Inventors: Tzyy-Sheng Horng, Kaohsiung (TW); Cheng-Yu Ho, Kaohsiung (TW); Kai-Syuan Chen, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 660 days.

(21) Appl. No.: 14/097,402

(22) Filed: Dec. 5, 2013

(65) Prior Publication Data
US 2014/0379286 A1    Dec. 25, 2014

(30) Foreign Application Priority Data

Jun. 20, 2013  (TW) .............................. 102121952 A

(51) Int. Cl.
*G01R 31/02* (2006.01)
*G01R 31/00* (2006.01)
(Continued)

(52) U.S. Cl.
CPC ............ *G01R 27/02* (2013.01); *G01R 31/002* (2013.01); *G01R 31/2822* (2013.01); *G01R 35/005* (2013.01)

(58) Field of Classification Search
None
See application file for complete search history.

(56) References Cited

U.S. PATENT DOCUMENTS

| 7,222,033 | B1 * | 5/2007 | Newson | G06F 17/5036 |
| | | | | 702/58 |
| 2010/0176817 | A1 * | 7/2010 | McLean | G01R 31/001 |
| | | | | 324/603 |
| 2012/0268153 | A1 * | 10/2012 | Nickel | G01R 31/3025 |
| | | | | 324/754.31 |

FOREIGN PATENT DOCUMENTS

| CN | 101782637 B | 4/2013 |
| TW | 201100836 A | 1/2011 |
| WO | 2005/069883 A2 | 8/2005 |

OTHER PUBLICATIONS

Kwak, SangKeun; Nah, Wansoo; Kim SoYoung; Electromagnetic Susceptibility Analysis of I/O Buffers Using the Bulk Curent Injection Method; Apr. 2013; Journal of Semiconductor Technology and Science; vol. 13, No. 2; pp. 114-126.*

(Continued)

*Primary Examiner* — Gregory J Toatley
*Assistant Examiner* — Terence Stifter, Jr.
(74) *Attorney, Agent, or Firm* — Jackson IPG PLLC; Demian K. Jackson

(57) ABSTRACT

A method for estimating PCB radiated emissions includes providing a BCI probe and a vector network analyzer; performing a calibration step; performing a measurement step; and performing an estimation step. A transfer impedance of the BCI probe is measured via a clamping device in the procedure of performing a calibration step. A measurement-input transfer function of an object and an output-input transfer function of the object are measured via the BCI probe in the procedure of performing a measurement step. Eventually, radiated emissions of the object can be estimated according to the measurement-input transfer function, the output-input transfer function and the transfer impedance in the procedure of performing an estimation step. The present (Continued)

invention accurately estimates radiated emissions of the object with low cost and high speed.

9 Claims, 8 Drawing Sheets

(51) Int. Cl.
*G01R 27/02* (2006.01)
*G01R 31/28* (2006.01)
*G01R 35/00* (2006.01)

(56) References Cited

OTHER PUBLICATIONS

Grassi, Flavia; Marlinani, Filippo; Pignari, Sergio A.; Circuit Modeling of Injection Probes for Bulk Current Injection; Aug. 2007; IEEE Transactions on Electromagnetic Compatibility; vol. 49, No. 3; p. 563-576.*

Ho,Cheng-Yu et al., Estimating the Reduction of Radiated Emissions From Microstrip Components Using Network Analyzer With a Bulk Current Injection Probe, IEEE Microwave and Wireless Components Letters, vol. 23, No. 2, Feb. 2013, Jan. 18, 2013, 108-110.

Ho,Cheng-Yu, Method of Measuring Common-Mode Current Conversion Coefficient for Estimating Variation in Radiated Emission from Printed Circuit Board Components, Doctorate Dissertation of National Sun Yat-sen University, Mar. 19, 2013.

\* cited by examiner

METHOD FOR ESTIMATING PCB RADIATED EMISSIONS

FIELD OF THE INVENTION

The present invention is generally relating to a method for estimating PCB radiated emissions, more particularly to the method for estimating PCB radiated emissions with a BCI probe.

BACKGROUND OF THE INVENTION

Modern consumer electronics products trend toward higher speed operation, multi-function and portability. Thus, integrated circuits and passive devices within electronics product become more dense from each other gradually so as to make radiated emissions interacted between electronic devices more severely. Particularly, a printed circuit board (PCB) likely generates serious radiated emissions by formation of antenna structure as long as work frequency achieves gigahertz (GHz) level.

A conventional method for measuring PCB radiated emissions is to receive radiated emissions by an antenna array and to analyze radiated emissions of an object via a data processor. However, the object and the antenna array must be spaced apart by at least one tenth wavelength of scanning frequency in order to maintain a better characteristic in receiving emissions. Besides, the conventional method must perform under the environment of an anechoic chamber. The measuring time or measuring costs will be relatively higher. Moreover, conventional method merely measures radiated emissions of the whole object and is unable to measure the radiated emissions of the object in part. Therefore, the mutual interference between each electronic device within the printed circuit board can not be obtained.

SUMMARY

A primary object of the present invention is to measure a transfer impedance of a BCI probe via a vector network analyzer and a clamping device, after that, a measurement-input transfer function of an object and an output-input transfer function of the object are measured via the BCI probe and the vector network analyzer, eventually, radiated emissions of the object can be estimated based on the transfer impedance of the BCI probe, the measurement-input transfer function of the object and the output-input transfer function of the object. The present invention rapidly accurately estimates radiated emissions of the object without the need for an anechoic chamber environment so as to reduce the costs and time substantially while estimating radiated emissions of the object. Besides, radiated emissions of the object in part can be measured via the BCI probe so that mutual interference between each electronic device in a printed circuit board is well learned.

A method for estimating PCB (Printed Circuit Board) radiated emissions of the present invention includes providing a BCI probe and a vector network analyzer; performing a calibration step; performing a measurement step; and performing an estimation step. The procedure of providing the BCI probe and the vector network analyzer provides a BCI (Bulk Current Injection) probe and a vector network analyzer, wherein the BCI probe comprises an inducting portion, a measuring space surrounded by the inducting portion and a measuring port coupled to the inducting portion, and the vector network analyzer comprises a signal output port, a probe-measuring port and a signal input port.

The procedure of performing a calibration step provides a clamping device having a chamber, a first calibration port and a second calibration port, wherein the BCI probe is disposed in the chamber, the signal output port of the vector network analyzer is coupled to the first calibration port, the probe-measuring port is coupled to the measuring port of the BCI probe, and the signal input port is coupled to the second calibration port. A calibration signal is outputted from the signal output port of the vector network analyzer to the first calibration port to make the BCI probe output an induction signal transmitted to the probe-measuring port of the vector network analyzer for obtaining a transfer impedance of the BCI probe. The procedure of performing a measurement step provides an object having at least one input port and at least one output port, wherein the object is disposed in the measuring space, the signal output port is coupled to the at least one input port of the object, the probe-measuring port is coupled to the measuring port of the BCI probe, and the signal input port is coupled to the at least one output port of the object. A test signal is outputted from the signal output port of the vector network analyzer to the at least one input port of the object to make the BCI probe output a power signal transmitted to the probe-measuring port of the vector network analyzer for measuring a measurement-input transfer function between the power signal and the test signal, and an output signal is outputted from the at least one output port to the signal input port of the vector network analyzer for measuring an output-input transfer function between the output signal and the test signal. In the procedure of performing an estimation step, radiated emissions of the object can be estimated according to the measurement-input transfer function, the output-input transfer function and the transfer impedance. In this invention, the transfer impedance of the BCI probe is measured via the vector network analyzer and the clamping device, thereafter, the measurement-input transfer function and the output-input transfer function of the object can be measured via the BCI probe and the vector network analyzer for obtaining radiated emissions of the object. The method of the present invention enables to measure highly accurate radiated emissions without the need for an anechoic chamber environment. Therefore, the present invention reduces the costs and time substantially for measuring radiated emissions.

DETAILED DESCRIPTION OF THE INVENTION

Figure 1:
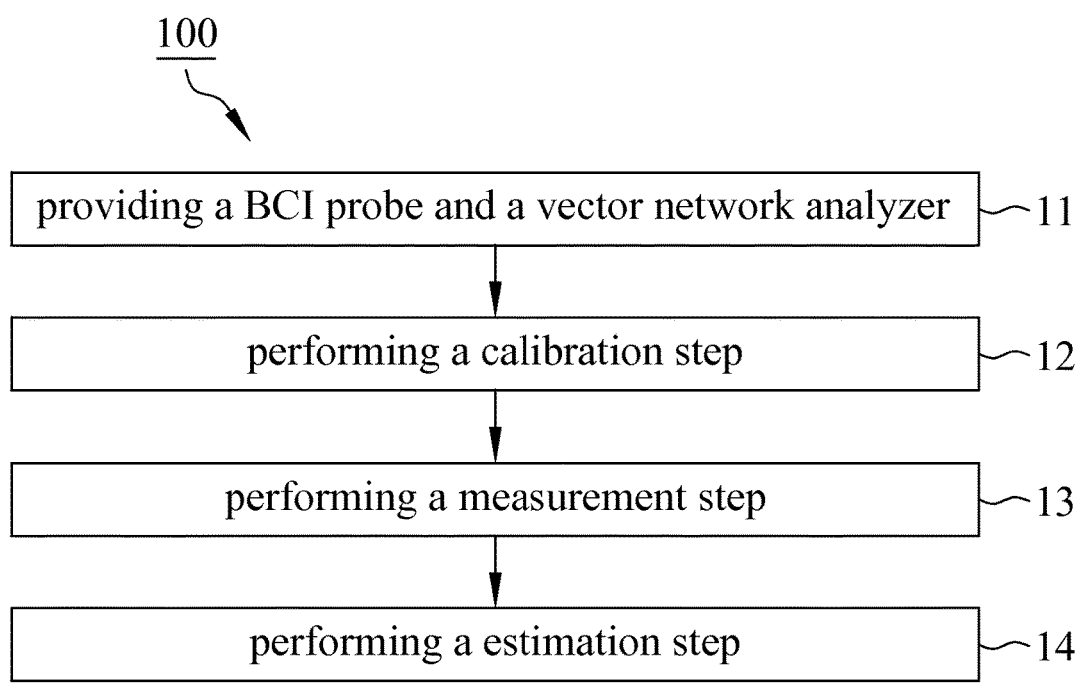
FIG. 1 is a flow chart illustrating a method for estimating PCB radiated emissions in accordance with an embodiment of the present invention.
Figure 2:
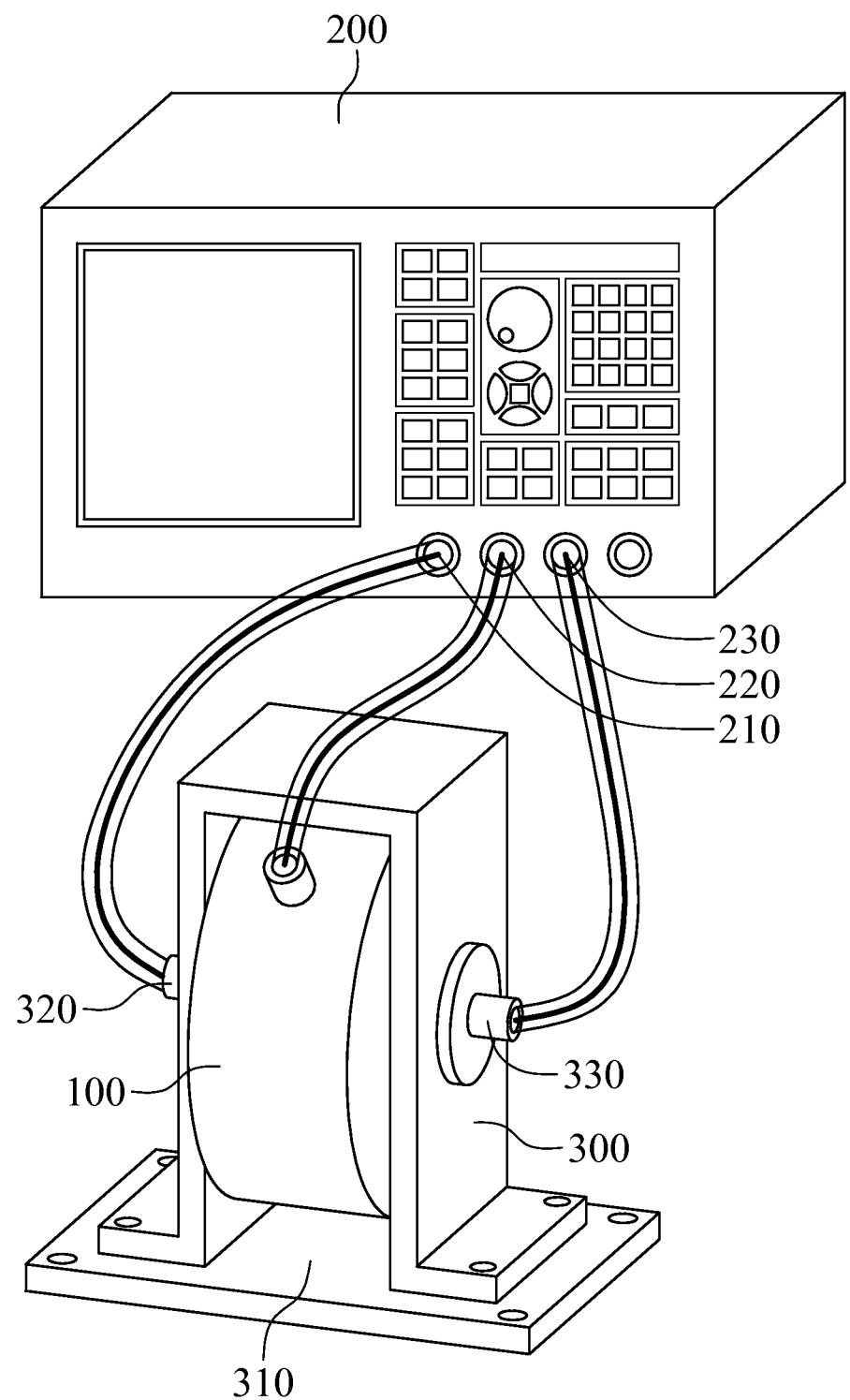
FIG. 2 is a perspective diagram illustrating a BCI probe, a vector network analyzer and a clamping device in accordance with the embodiment of the present invention.
Figure 3:
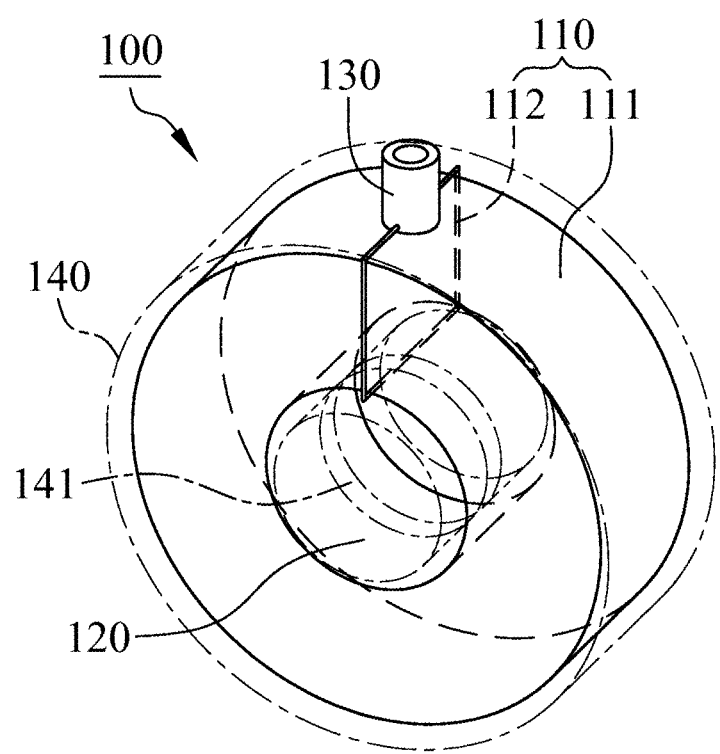
FIG. 3 is a perspective diagram illustrating the BCI probe in accordance with the embodiment of the present invention.

Referring to FIGS. 1, 2 and 3, a method 10 for estimating PCB (Printed Circuit Board) radiated emissions in accordance with a first embodiment of the present invention includes providing a BCI probe and a vector network analyzer 11; performing a calibration step 12; performing a measurement step 13; and performing an estimation step 14. The step 11 of providing a BCI probe and a vector network analyzer provides a BCI (Bulk Current Injection) probe 100 and a vector network analyzer 200. With reference to FIG. 3, the BCI probe 100 comprises an inducting portion 110, a measuring space 120 surrounded by the inducting portion 110, a measuring port 130 coupled to the inducting portion 110 and a case 140, wherein the inducting portion 110 is clad by the case 140.

In this embodiment, the inducting portion 110 comprises a ring-shaped yoke 111 and an inductive coil 112, the measuring space 120 is surrounded by the ring-shaped yoke 111, the ring-shaped yoke 111 is winded around by the inductive coil 112, and the measuring port 130 electrically connects to the inductive coil 112. The case 140 comprises a slot 141 communicating with the measuring space 120 and revealing the ring-shaped yoke 111 of the inducting portion 110. Referring to FIG. 2, the vector network analyzer 200 comprises a signal output port 210, a probe-measuring port 220 and a signal input port 230.

Figure 4:
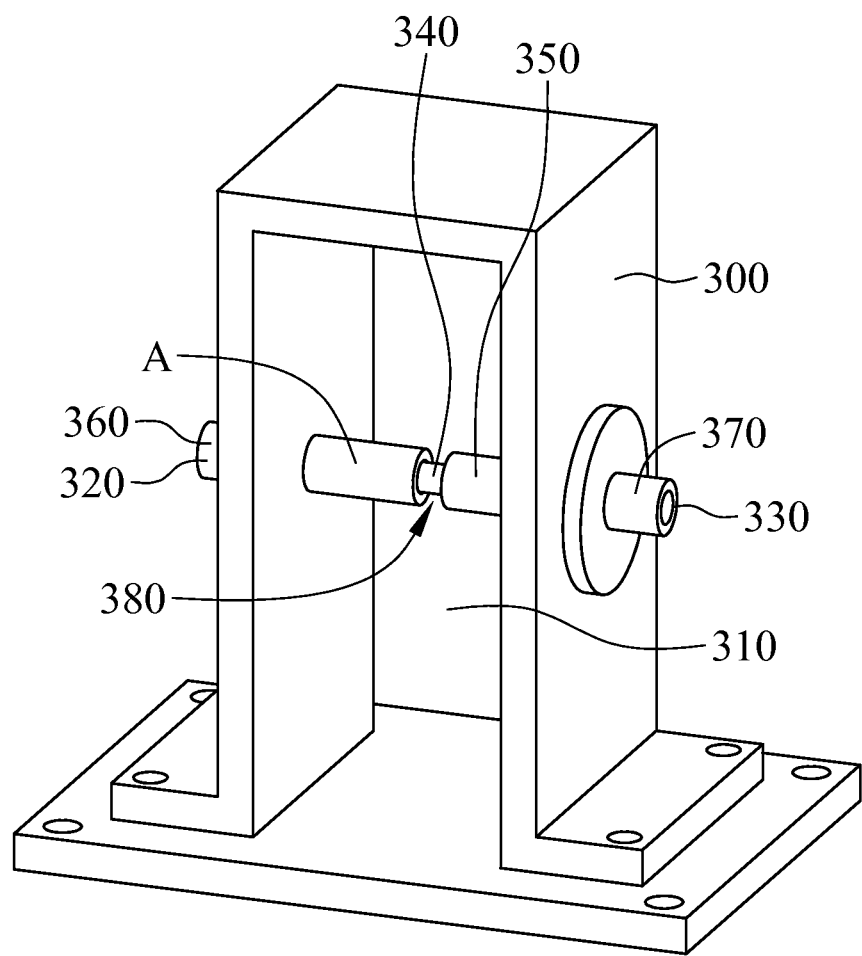
FIG. 4 is a perspective diagram illustrating the clamping device in accordance with the embodiment of the present invention.

With reference to FIGS. 1, 2 and 4, the procedure of performing a calibration step 12 provides a clamping device 300 for calibration, the clamping device 300 comprises a chamber 310, a first calibration port 320, a second calibration port 330 and a coaxial cable A having an inner wire 340, an insulating layer 350, a first terminal 360, a second terminal 370 and an exposing portion 380 located between the first terminal 360 and the second terminal 370. The inner wire 340 is clad by the insulating layer 350, the exposing portion 380 is located in the chamber 310 and reveals the inner wire 340, the first calibration port 320 of the clamping device 300 is located at the first terminal 360, and the second calibration port 330 of the clamping device 300 is located at the second terminal 370. Next, referring to FIGS. 2 and 4, the BCI probe 100 is disposed in the chamber 310, the exposing portion 380 of the coaxial cable A is located in the measuring space 120, the signal output port 210 of the vector network analyzer 200 is coupled to the first calibration port 320, the probe-measuring port 220 is coupled to the measuring port 130 of the BCI probe 100, the signal input port 230 is coupled to the second calibration port 330, wherein the coupling relationship between the signal input port 230 and the second calibration port 330 is utilized for compensating the loss of common mode current caused from the clamping device 300, and the compensation is to increase the accuracy for estimating radiated emissions under gigahertz (GHz) environment. Thereafter, a calibration signal is outputted from the signal output port 210 of the vector network analyzer 200 to the first calibration port 320 to make the BCI probe 100 outputs an induction signal transmitted to the probe-measuring port 220 of the vector network analyzer 200 for obtaining a transfer impedance of the BCI probe 100. The formula for obtaining the transfer impedance of the BCI probe 100 is $$Z_T(\omega) = \frac{V_m}{I_i} = \left(\frac{V_i}{I_i}\right) \cdot \left(\frac{V_m}{V_i}\right),$$

wherein (Volts) is the amplitude of the induction signal, $I_i$ (Ampere) is the level of a current flew through the clamping device 300, and $V_i$ (Volts) is the level of the calibration signal.

Figure 5:
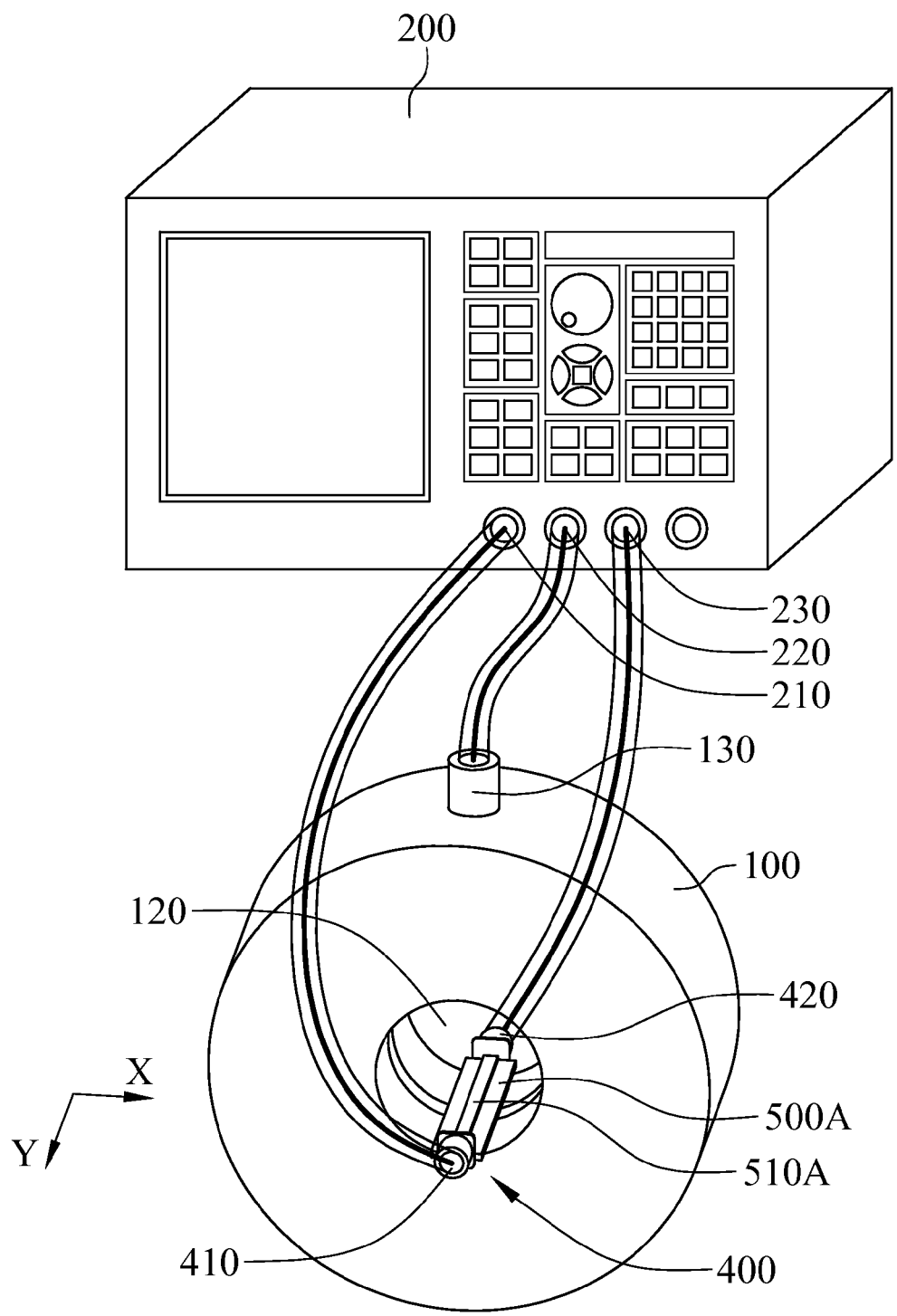
FIG. 5 is a perspective diagram illustrating the BCI probe, the vector network analyzer and a first printed circuit board in accordance with a practical application of the present invention.

With reference to FIGS. 1 and 5, the procedure of performing a measurement step 13 provides an object 400 having at least one input port 410 and at least one output port 420, wherein the object 400 is disposed in the measuring space 120, the signal output port 210 is coupled to the at least one input port 410 of the object 400, the probe-measuring port 220 is coupled to the measuring port 130 of the BCI probe 100, and the signal input port 230 is coupled to the at least one output port 420 of the object 400. Particularly, the coupling relationship between the signal input port 230 and the at least one output port 420 of the object 400 is utilized for compensating the loss of common mode current caused from the object 400, and the compensation is to increase the accuracy for estimating radiated emissions under gigahertz (GHz) environment. After that, a test signal is outputted from the signal output port 210 of the vector network analyzer 200 to the at least one input port 410 of the object 400 to make the BCI probe 100 output a power signal transmitted to the probe-measuring port 220 of the vector network analyzer 200, and an output signal is outputted from the at least one output port 420 to the signal input port 230 of the vector network analyzer 200 for measuring a measurement-input transfer function between the power signal and the test signal and an output-input transfer function between the output signal and the test signal.

With reference to FIGS. 1 and 5, in the procedure of performing an estimation step 14, a formula for estimating radiated emissions of the object 400 based on the measurement-input transfer function, the output-input transfer function and the transfer impedance is $$|E_{far}(\omega)| = 4\pi \times 10^{-7} \frac{\left|\frac{S_{mi}(\omega) - S_{oi}(\omega)}{Z_T(\omega)} \cdot V_{in}\right| \cdot L \cdot \omega \cdot \cos\left(\frac{1}{2}\beta h\right)}{2\pi R},$$

wherein $E_{far}$ ($\omega$) (db µV/m) is radiated emissions of the object 400, $S_{mi}$ (db) is the measurement-input transfer function, $S_{oi}$ (db) is the output-input transfer function, $Z_T(\omega)$ (db Ω) is the transfer impedance of the BCI probe 100, $V_{in}$ (Volts) is the level of the test signal, L (mm) is the length of the object 400, h (mm) is the thickness of a substrate of the object 400, β is the phase constant of free space, and R (meter) is the distance between a measuring point and the object 400. Referring to FIG. 5, preferably, the object 400 comprises an X-axis direction and a Y-axis direction perpendicular to the X-axis direction, in the measurement step, when the inducting portion 110 of the BCI probe 100 is parallel to the X-axis direction, radiated emissions of the object 400 along the X-axis direction can be measured by the BCI probe 100; when the inducting portion 110 of the BCI probe 100 is parallel to the Y-axis direction, radiated emissions of the object 400 along the Y-axis direction can be measured by the BCI probe 100. As long as the radiated emissions along the X-axis direction and the radiated emissions along the Y-axis direction determined respectively, the sum of radiated emissions of the object 400 can be obtained by a following formula $E_{total,far} = \sqrt{E_{x,far}^2 + E_{y,far}^2}$, wherein $E_{total,far}$ (db μV/m) is the sum of radiated emissions of the object 400, $E_{x,far}$ (db μV/m) is radiated emissions of the object 400 along the X-axis direction, and $E_{y,far}$ (db μV/m) is radiated emissions of the object 400 along the Y-axis direction.

Figure 6:
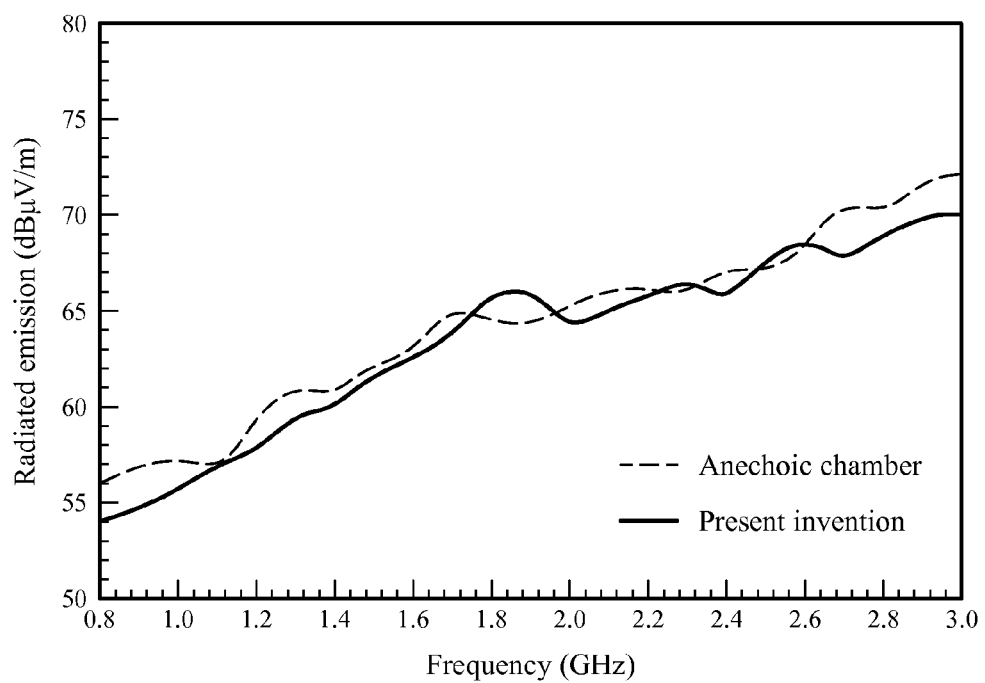
FIG. 6 is a relation between radiated emissions and frequency of the first printed circuit board in accordance with a practical application of the present invention.

A practical application of the present invention is illustrated in FIG. 5. The present invention practically tests and estimates radiated emissions of a first printed circuit board 500A, wherein the first printed circuit board 500A comprises a single micro-strip line 510A so that the first printed circuit board 500A merely generates radiated emissions along the X-axis direction. After obtaining a transfer impedance of the BCI probe 100 in the procedure of performing a calibration step 12, the inducting portion 110 of the BCI probe 100 must be parallel to the X-axis direction of the first printed circuit board 500A for measuring a measurement-input transfer function and an output-input transfer function of the first printed circuit board 500A in the procedure of performing a measurement step 13. Eventually, substituting known measurement-input transfer function and known output-input transfer function into the mentioned formula for estimating radiated emissions so as to obtain radiated emissions of the first printed circuit board 500A. Further, FIG. 6 indicates a comparison diagram that contains with measuring values of radiated emissions of the first printed circuit board 500A measured by method of the present invention and measuring values of radiated emissions of the first printed circuit board 500A measured in an anechoic chamber. The test standard for measuring radiated emissions in the anechoic chamber states that the distance between an antenna and an object is 3 meters. Therefore, we substitute 3 meters into R of the formula for estimating radiated emissions of the object 400. After calculation, the measuring values of radiated emissions measured by method of the present invention are quite similar to the measuring values measured of radiated emissions measured in the anechoic chamber. The present invention effectively reduces the costs and time in measuring radiated emissions and obtains accurate data.

Figure 7:
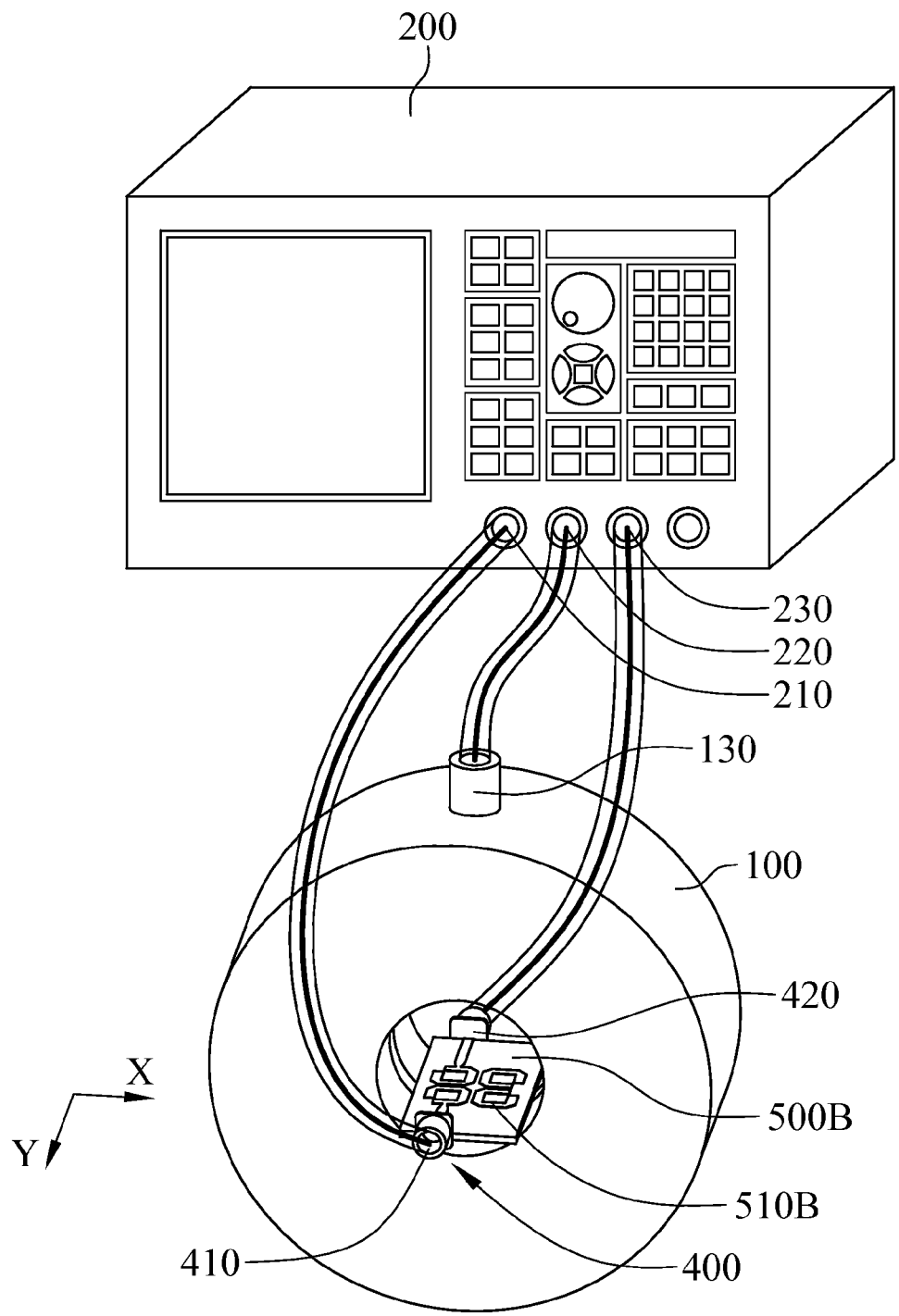
FIG. 7 is a perspective diagram illustrating the BCI probe, the vector network analyzer and a second printed circuit board in accordance with a practical application of the present invention.
Figure 8:
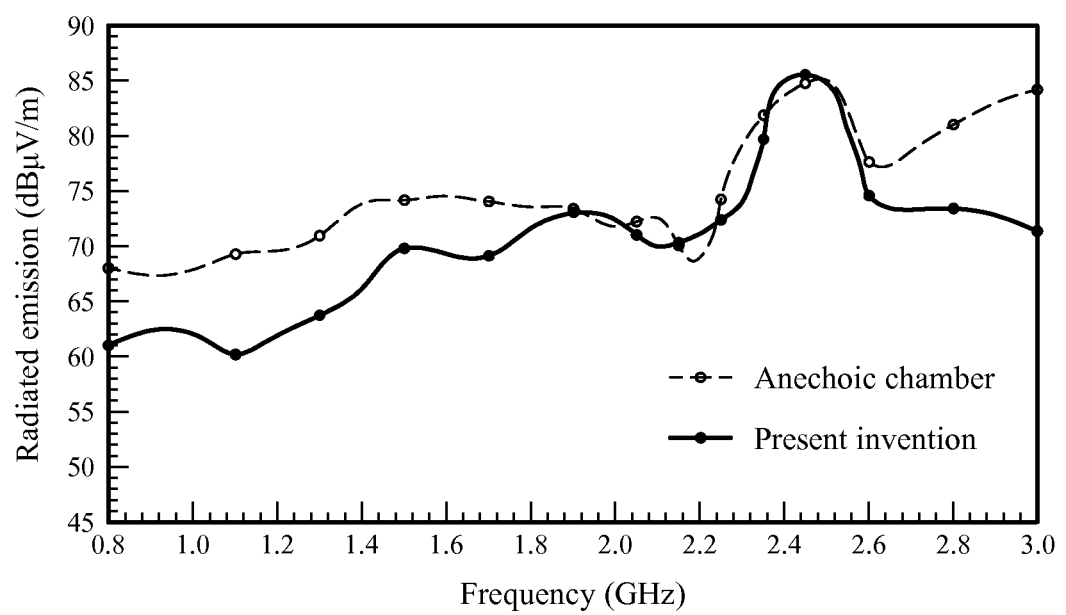
FIG. 8 is a relation between radiated emissions and frequency of the second printed circuit board in accordance with a practical application of the present invention.

Another practical application of the present invention is illustrated in FIG. 7. The present invention practically tests and estimates radiated emissions of a second printed circuit board 500B having a net-type band pass filter 510B. The second printed circuit board 500B likely generates radiated emissions along the X-axis direction and radiated emissions along the Y-axis direction. Therefore, after obtaining a transfer impedance of the BCI probe 100 in the procedure of performing a calibration step 12, the procedure of performing a measurement step 13 have to measure a measurement-input transfer function of the second printed circuit board 500B along the X-axis direction, an output-input transfer function of the second printed circuit board 500B along the X-axis direction, a measurement-input transfer function of the second printed circuit board 500B along the Y-axis direction and an output-input transfer function of the second printed circuit board 500B along the Y-axis direction respectively. Thereafter, we substitute those characteristics mentioned above into the mentioned formula for estimating radiated emissions to obtain radiated emissions of the second printed circuit board 500B along the X-axis direction and radiated emissions of the second printed circuit board 500B along the Y-axis direction respectively. Finally, by formula for obtaining the sum of radiated emissions of the object, the sum of radiated emissions of the second printed circuit board 500B can be obtained. FIG. 8 indicates a comparison diagram that contains with measuring values of radiated emissions of the second printed circuit board 500B measured by method of the present invention and measuring values of radiated emissions of the second printed circuit board 500B measured in the anechoic chamber. We noticed that the measuring values of radiated emissions measured by method of the present invention are quite similar to the measuring values of radiated emissions measured in the anechoic chamber.

In this invention, the transfer impedance of the BCI probe 100 is measured via the vector network analyzer 200 and the clamping device 300, thereafter, the measurement-input transfer function and the output-input transfer function of the object 400 can be measured via the BCI probe 100 and the vector network analyzer 200 for obtaining radiated emissions of the object 400. The method of the present invention enables to measure highly accurate radiated emissions without the need for the anechoic chamber environment. Therefore, the present invention reduces the costs and time substantially in measuring radiated emissions.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A method for estimating PCB radiated emissions including:

providing a BCI (Bulk Current Injection) probe and a vector network analyzer, wherein the BCI probe comprises an inducting portion, a measuring space surrounded by the inducting portion and a measuring port coupled to the inducting portion, the vector network analyzer comprises a signal output port, a probe-measuring port and a signal input port;

performing a calibration step for providing a clamping device having a chamber, a first calibration port and a second calibration port, wherein the BCI probe is disposed in the chamber, the signal output port of the vector network analyzer is coupled to the first calibration port, the probe-measuring port is coupled to the measuring port of the BCI probe, the signal input port is coupled to the second calibration port, wherein a calibration signal is outputted from the signal output port of the vector network analyzer to the first calibration port to make the BCI probe output an induction signal transmitted to the probe-measuring port of the vector network analyzer for obtaining a transfer impedance of the BCI probe;

performing a measurement step for proving an object having at least one input port and at least one output port, wherein the object is disposed in the measuring space, the signal output port is coupled to the at least one input port of the object, the probe-measuring port is coupled to the measuring port of the BCI probe, the signal input port is coupled to the at least one output port of the object, wherein a test signal is outputted from the signal output port of the vector network analyzer to the at least one input port of the object to make the BCI probe output a power signal transmitted to the probe-measuring port of the vector network analyzer, wherein an output signal is outputted from the at least one output port to the signal input port of the vector network analyzer for measuring a measurement-input transfer function between the power signal and the test signal and an output-input transfer function between the output signal and the test signal; and performing an estimation step for estimating radiated emissions of the object based on the measurement-input transfer function, the output-input transfer function and the transfer impedance.

2. The method for estimating PCB radiated emissions in accordance with claim 1, wherein a formula for estimating radiated emissions of the object is $$|E_{far}(\omega)| = 4\pi \times 10^{-7} \frac{\left|\frac{S_{mi}(\omega) - S_{oi}(\omega)}{Z_T(\omega)} \cdot V_{in}\right| \cdot L \cdot \omega \cdot \cos\left(\frac{1}{2}\beta h\right)}{2\pi R},$$

wherein $E_{far}(\omega)$ (db μV/m) is radiated emissions of the object, $S_{mi}$ (db) is the measurement-input transfer function, $S_{oi}$ (db) is the output-input transfer function, $Z_T(\omega)$ (db Ω) is the transfer impedance of the BCI probe, $V_{in}$ (Volts) is the level of the test signal, L (mm) is the length of the object, h (mm) is the thickness of a substrate of the object, β is the phase constant of free space, and R (meter) is the distance between a measuring point and the object.

3. The method for estimating PCB radiated emissions in accordance with claim 2, wherein a formula for obtaining the transfer impedance of the BCI probe is $$Z_T(\omega) = \frac{V_m}{I_i} = \left(\frac{V_i}{I_i}\right) \cdot \left(\frac{V_m}{V_i}\right),$$

wherein $V_m$ (Volts) is the amplitude of the induction signal, (Ampere) is the level of a current flew through the clamping device, and $V_i$ (Volts) is the level of the calibration signal.

4. The method for estimating PCB radiated emissions in accordance with claim 2, wherein the object comprises an X-axis direction and a Y-axis direction perpendicular to the X-axis direction, wherein in the measurement step, when the inducting portion of the BCI probe is parallel to the X-axis direction, radiated emissions of the object along the X-axis direction can be measured by the BCI probe, when the inducting portion of the BCI probe is parallel to the Y-axis direction, radiated emissions of the object along the Y-axis direction can be measured by the BCI probe.

5. The method for estimating PCB radiated emissions in accordance with claim 4, wherein the sum of radiated emissions of the object can be obtained by a following formula $E_{total,far} = \sqrt{E_{x,far}^2 + E_{y,far}^2}$, wherein $E_{total,far}$ (db μV/m) is the sum of radiated emissions of the object, $E_{x,far}$ (db μV/m) is radiated emissions of the object along the X-axis direction, and $E_{y,far}$ (db μV/m) is radiated emissions of the object along the Y-axis direction.

6. The method for estimating PCB radiated emissions in accordance with claim 1, wherein the clamping device comprises a coaxial cable having an inner wire, an insulating layer, a first terminal, a second terminal and a exposing portion located between the first terminal and the second terminal, the inner wire is clad by the insulating layer, the exposing portion reveals the inner wire, the first calibration port of the clamping device is located at the first terminal, and the second calibration port of the clamping device is located at the second terminal.

7. The method for estimating PCB radiated emissions in accordance with claim 6, wherein in the calibration step, when the BCI probe is disposed in the chamber, the exposing portion of the coaxial cable is located at the measuring space.

8. The method for estimating PCB radiated emissions in accordance with claim 1, wherein the inducting portion of the BCI probe comprises a ring-shaped yoke and an inductive coil, the measuring space is surrounded by the ring-shaped yoke, the ring-shaped yoke is winded around by the inductive coil, and the measuring port electrically connects to the inductive coil.

9. The method for estimating PCB radiated emissions in accordance with claim 8, wherein the BCI probe further comprises a case having a slot, the inducting portion is clad by the case, the slot communicates with the measuring space and reveals the ring-shaped yoke of the inducting portion.

\* \* \* \* \*